United States Patent

Huang et al.

(10) Patent No.: US 10,074,436 B1
(45) Date of Patent: Sep. 11, 2018

(54) MEMORY DEVICE AND DATA READING METHOD THEREOF

(71) Applicant: Winbond Electronics Corp., Taichung (TW)

(72) Inventors: Koying Huang, San Jose, CA (US); Teng Su, San Jose, CA (US)

(73) Assignee: Winbound Electronics Corp., Taichung (TW)

( * ) Notice: Subject to any disclaimer, the term of this patent is extended or adjusted under 35 U.S.C. 154(b) by 0 days.

(21) Appl. No.: 15/620,835

(22) Filed: Jun. 13, 2017

(51) Int. Cl.
*G11C 11/4076* (2006.01)
*G11C 16/28* (2006.01)
*G11C 16/08* (2006.01)
*G11C 16/24* (2006.01)
*G11C 16/32* (2006.01)
*G11C 29/00* (2006.01)

(52) U.S. Cl.
CPC ............. *G11C 16/28* (2013.01); *G11C 16/08* (2013.01); *G11C 16/24* (2013.01); *G11C 16/32* (2013.01); *G11C 29/76* (2013.01)

(58) Field of Classification Search
CPC .................................................. G11C 11/4076
USPC ....................................................... 365/233.5
See application file for complete search history.

(56) References Cited

U.S. PATENT DOCUMENTS

| | | | | |
|---|---|---|---|---|
| 6,148,424 A | * | 11/2000 | Tsutsui | G01R 31/31919 714/720 |
| 2002/0039323 A1 | * | 4/2002 | Tokutome | G11C 7/1066 365/233.12 |
| 2012/0195109 A1 | * | 8/2012 | Noro | G11C 7/08 365/154 |
| 2014/0029367 A1 | * | 1/2014 | Jung | G11C 11/40615 365/222 |
| 2015/0357019 A1 | * | 12/2015 | Wheeler | G11C 11/4091 365/189.05 |

FOREIGN PATENT DOCUMENTS

| | | |
|---|---|---|
| CN | 102012867 | 4/2011 |
| TW | I501247 | 9/2015 |

* cited by examiner

Primary Examiner — Min Huang
(74) Attorney, Agent, or Firm — JCIPRNET

(57) ABSTRACT

A memory device and a data reading method are provided. A dummy circuit performs a read operation in synchronism with a data access circuit according to an address signal, so as to estimate time points at which the data access circuit completes each of operating procedures, and enable the data access circuit to execute a next operating procedure when completing an operating procedure.

18 Claims, 5 Drawing Sheets

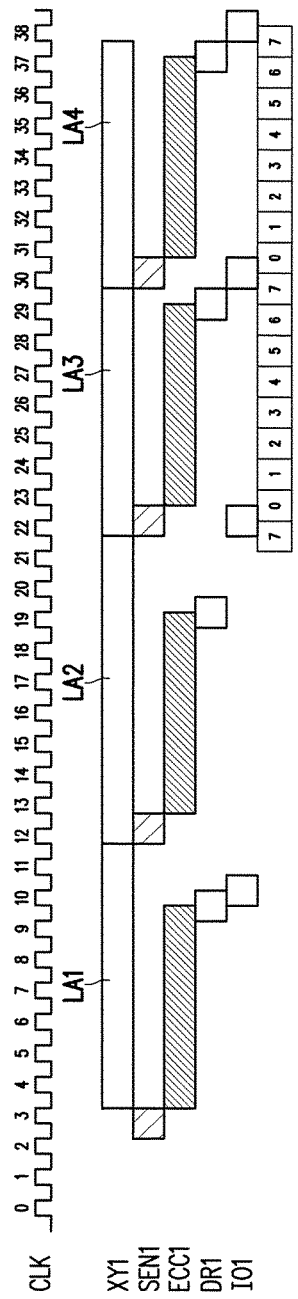
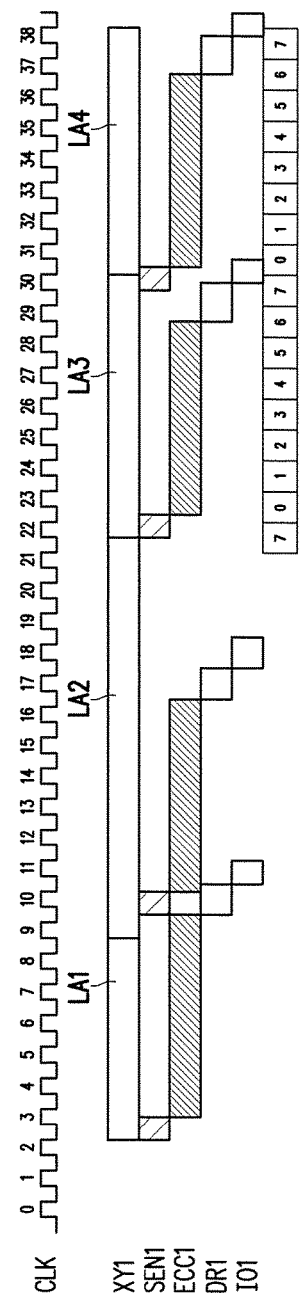
FIG. 2 (PRIOR ART)
FIG. 3

MEMORY DEVICE AND DATA READING
METHOD THEREOF

BACKGROUND OF THE INVENTION

1. Field of the Invention

The invention relates to an electronic device, and more particularly, to a memory device and a data reading method thereof.

2. Description of Related Art

Owing to fewer pins and simple interface, serial flash memories have become popularized. In general, the serial flash memories operate based on an externally-provided clock signal. For example, operating times for changing access addresses, data sense, error correction and data register are all determined on basis of the externally-provided clock signal. In some memory devices, before the first read data is outputted, a dummy clock with multiple cycles can be assigned for data latch to increase the speed for reading data.

Because the number of cycles of the dummy clocks used by the memory devices corresponding to different specifications may be different, the difficulty in assigning an operating schedule for the memory will increase if the number of cycle of the dummy clock is smaller. For example, the operating time required by some of memory operations may be shorter than the number of clock cycles being assigned. However, the same number of clock cycles will still be assigned for the memory operations since the memory operations are performed based on the externally-provided clock signal, which results in a waste of time, thereby lowering a reading efficiency of the memory device.

SUMMARY OF THE INVENTION

The invention is directed to a memory device and a data reading method, which are capable of effectively improving the reading efficiency of the memory device.

A memory device of the invention includes a memory array, an address generator and a data access circuit. The address generator generates an address signal. The data access circuit is coupled to the memory array and the address generator, and performs a reading operation on the memory array according to an external clock signal and the address signal so as to output read data. The reading operation includes a plurality of operating procedures. The dummy circuit is coupled to the data access circuit and the address generator, and executes the operating procedures according to the address signal, so as to estimate time points at which the data access circuit completes each of the operating procedures. The dummy circuit enables the data access circuit to execute a next operating procedure when completing an operating procedure.

The invention also provides a data reading method of a memory device. The memory device includes a memory array, an address generator and a data access circuit. The address generator generates an address signal. The data access circuit performs a read operation on the memory array according to an external clock signal and the address signal so as to output read data. The reading operation includes a plurality of operating procedures. The data reading method of the memory device includes the following steps. A dummy circuit is provided, and the operating procedures are started by the dummy circuit according to the address signal, so as to estimate time points at which the data access circuit completes each of the operating procedures. The data access circuit is enabled to execute a next operating procedure when the dummy circuit completes an operating procedure such that the data access circuit sequentially completes the operating procedures to output the read data.

Based on the above, the dummy circuit proposed by the invention can perform the read operation in synchronism with the data access circuit according to the address signal, so as to estimate the time points at which the data access circuit completes each of the operating procedures, and enable the data access circuit to execute the next operating procedure when completing one operating procedure. Accordingly, the time points at which each of the operating procedures is executed in the reading operation are not restricted by the external clock signal, and instead, the operating schedule is assigned according to the time actually required for executing each of the operating procedures. As a result, an idle time during operation of the memory can be significantly reduced to effectively improve the reading efficiency of the memory device.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a schematic diagram of an operating schedule of a reading operation of a memory device in the conventional art.

FIG. 3 is a schematic diagram of an operating schedule of a reading operation of a memory device according to an embodiment of the invention.

DESCRIPTION OF THE EMBODIMENTS

Figure 1:
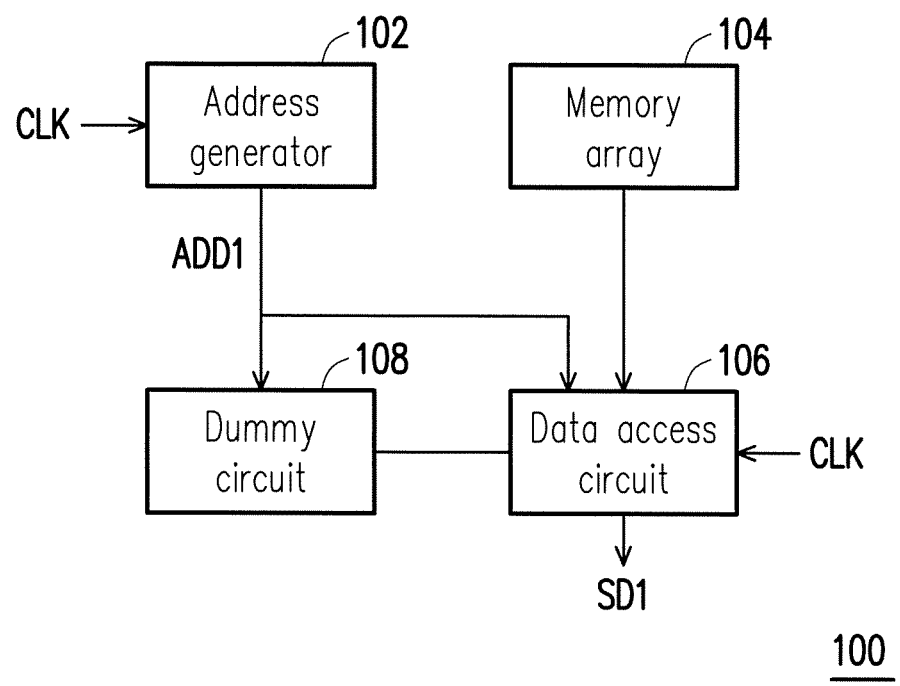
FIG. 1 is a schematic diagram of a memory device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

With reference to FIG. 1, FIG. 1 is a schematic diagram of a memory device according to an embodiment of the invention. A memory device 100 can include an address generator 102, a memory array 104, a data access circuit 106 and a dummy circuit 108. The address generator 102 is coupled to the data access circuit 106 and the dummy circuit 108, and the memory array 104 may be, for example, a flash memory array (e.g., an NOR flash memory array), but the invention is not limited to the above. Further, the dummy circuit 108 and the data access circuit 106 can have identical circuit features (e.g., they can be manufactured by identical manufacturing processes and circuit designs). The data access circuit 106 is coupled to the memory array 104 and the dummy circuit 108. The address generator 102 is configured to generate an address signal ADD1 for the data access circuit 106 and the dummy circuit 108 according to an external clock signal CLK. The data access circuit 106 can perform a reading operation on the memory array 104 according to the external clock signal CLK and the address signal ADD1 so as to output read data SD1. The reading operation can include a plurality of operating procedures, such as a selection operating procedure for selectively driving a word line and a bit line of the memory array 104, a data sense operating procedure for data corresponding to the address signal ADD1, an error correction operating procedure for sensed data, an operating procedure for temporarily storing corrected data, etc. The dummy circuit 108 can perform the read operation according to the address signal ADD1 so as to estimate time points at which the data access circuit 106 completes each of the operating procedures, and enable the data access circuit 106 to execute a next operating procedure when completing one operating procedure.

For instance, the dummy circuit 108 can sequentially perform the selection operating procedure, the data sense operating procedure and the error correction operating procedure described above according to the address signal ADD1, and enable the data access circuit 106 to perform the next operating procedure (i.e., the data sense operating procedure, the error correction operating procedure and the operating procedure for temporarily storing the corrected data) at the time point when the respective one of the selection operating procedure, the data sense operating procedure and the error correction operating procedure is completed. As described above, the dummy circuit 108 and the data access circuit 106 have the identical circuit features. Therefore, when the dummy circuit 108 completes one specific operating procedure, it can be expected that the data access circuit 106 also completes the same specific operating procedure without being affected by power voltage, temperature variation or other environmental factors. By enabling the data access circuit 106 to execute the next operating procedure when the dummy circuit 108 completes said specific operating procedure, the time points at which each of the operating procedures being executed in the reading operation are no longer restricted by the external clock signal CLK, and instead, the operating schedules are assigned according to the time actually required for executing each of the operating procedures. As a result, the idle time during operation of the memory can be significantly reduced to effectively improve the reading efficiency of the memory device.

For instance, with reference to FIG. 2 and FIG. 3, FIG. 2 is a schematic diagram of an operating schedule of a reading operation of a memory device in the conventional art, and FIG. 3 is a schematic diagram of an operating schedule of a reading operation of a memory device according to an embodiment of the invention. In FIG. 2 and FIG. 3, the memory device has a dummy clock with 20 cycles (as shown in FIG. 2, cycles numbered 3 to 22 of the external clock signal CLK) to be assigned for a selection operating procedure XY1, a data sense operating procedure SEN1, an error correction operating procedure ECC1, an operating procedure DR1 for temporarily storing the corrected data and an input/output operating procedure IO1 for outputting the read data SD1 according to the corrected data. In FIG. 2, each data latch period is an integer multiple of a half-cycle of the dummy clock (e.g., a first data latch period LA1 is equivalent to 9.5 cycles of the dummy clock, whereas a second data latch period LA2 is equivalent to 10.5 cycles of the dummy clock), and the operating time of each operating procedure is also an integer multiple of the half-cycle of the dummy clock (e.g., a period of the selection operating procedure XY1 is equivalent to 1 cycle of the dummy clock). Further, because the time points at which each of the operating procedures being completed are unknown, the cycles with the number higher than what actually required are often assigned for each data latch period and each operating procedure, thereby lowering the reading efficiency of the memory device.

In the embodiment of the invention shown in FIG. 3, because the dummy circuit 108 of the memory device 100 is capable of enabling the data access circuit 106 to execute the next operating procedure (i.e., the data sense operating procedure SEN1) when completing the selection operating procedure XY1, instead of assigning 1 cycle of the dummy clock for the selection operating procedure XY1 as required in the conventional art, the dummy circuit 108 can enable the data access circuit 106 to execute the data sense operating procedure SEN1 when completing the selection operating procedure XY1 by spending only approximately 0.6 cycle of the dummy clock. As described above, the operating procedures of the present embodiment, including the selection operating procedure XY1, the data sense operating procedure SEN1, the error correction operating procedure ECC1 and the operating procedure DR1 for temporarily storing the corrected data, are all activated by the dummy circuit 108 rather than being activated according to the number of cycles of the external clock signal CLK. Therefore, the next operating procedure can be enabled immediately when one operating procedure is completed without being restricted by the external clock signal CLK. Further, as shown in FIG. 3, the dummy circuit 108 can also enable the data access circuit 106 to execute the selection operating procedure XY1 according a next address signal when completing the data sense operating procedure SEN1 rather than proceeding to the selection operation XY1 for the next address signal only after waited for all the number of cycles of the dummy clock being assigned are all used as required in the conventional art. In this way, the memory device 100 of the present embodiment can effectively reduce the idle time so as to improve the reading efficiency of memory device 100.

Figure 4:
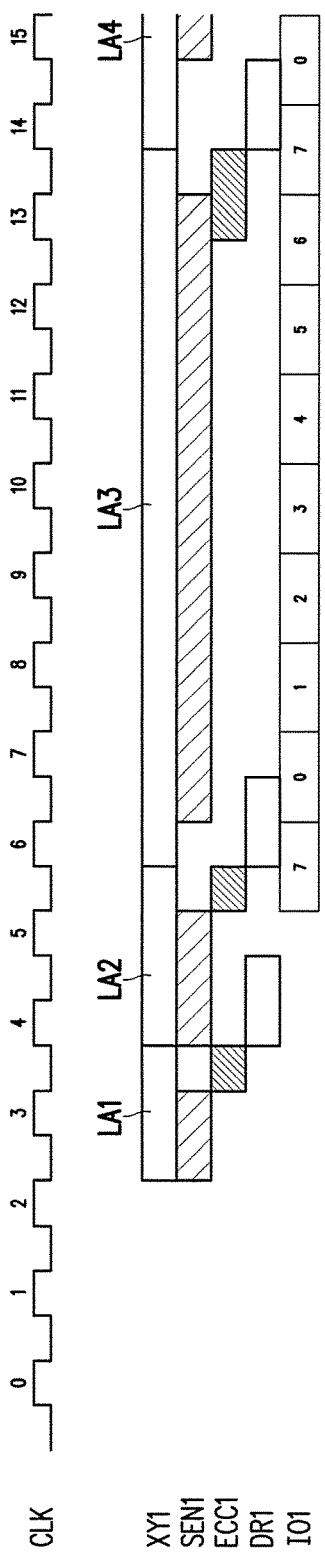
FIG. 4 is a schematic diagram of an operating schedule of a reading operation of a memory device in the conventional art.

Moreover, given that the idle time can be effectively reduced and the reading operation can be performed without being restricted by the external clock signal CLK, the memory device 100 of the foregoing embodiment is also suitable for application in the case where fewer dummy clock cycles are assigned. For instance, FIG. 4 is a schematic diagram of an operating schedule of a reading operation of a memory device in the conventional art. In FIG. 4, the memory device only has a dummy clock with only 4 cycles (as shown in FIG. 4, cycles numbered 3 to 6 of the external clock signal CLK) to be assigned for the data sense operating procedure SEN1, the error correction operating procedure ECC1, the operating procedure DR1 for temporarily storing the corrected data and the input/output operating procedure IO1 for outputting the read data SD1 according to the corrected data. Because the number of cycles usable by the dummy clock is smaller, assigning the dummy clock for each operating procedure becomes difficult and the situation where the cycles of the dummy clock assigned are far more than what actually required for executing the operating procedures, resulting in a waste of time thereby lowering the reading efficiency of the memory device. For example, in FIG. 4, the data sense operating procedure SEN1 and the error correction operating procedure ECC1 use 1 cycle of the dummy clock and 0.5 cycle of the dummy clock respectively. However, the time actually required for executing the error correction operating procedure ECC1 is far less than the time required for executing the data sense operating procedure SEN1. This problem can be effectively solved by utilizing the memory device 100 of the foregoing embodiment because the time points at which each of the operating procedures is executed in the reading operation performed by the memory device 100 of the foregoing embodiment are not restricted by the external clock signal CLK, and instead, the operating schedule is assigned according to the time actually required for executing each of the operating procedures. The method of performing the reading operation by the memory device 100 has been described in the foregoing embodiments, which are not repeated hereinafter.

It should be noted, although the reading operation performed by the memory device 100 is with the periods using of the dummy clock as an example in the foregoing embodiments, it is not intended to limited the reading operation of the foregoing embodiments only to be performed with the periods using the dummy clock. For example, in the embodiment of FIG. 3, after the periods using the dummy clock, the reading operation can still be performed with the same method in formal data reading periods (e.g., a third data latch period LA3 and a fourth data latch period LA4). In this case, the selection operating procedure XY1 is activated by the external clock signal CLK for the different address signals in the formal data reading periods, and the input/output operating procedure IO1 (which is used by the memory device 100 to output 8-bit data in the present embodiment) is also activated by the external clock signal CLK in the data latch periods.

Figure 5:
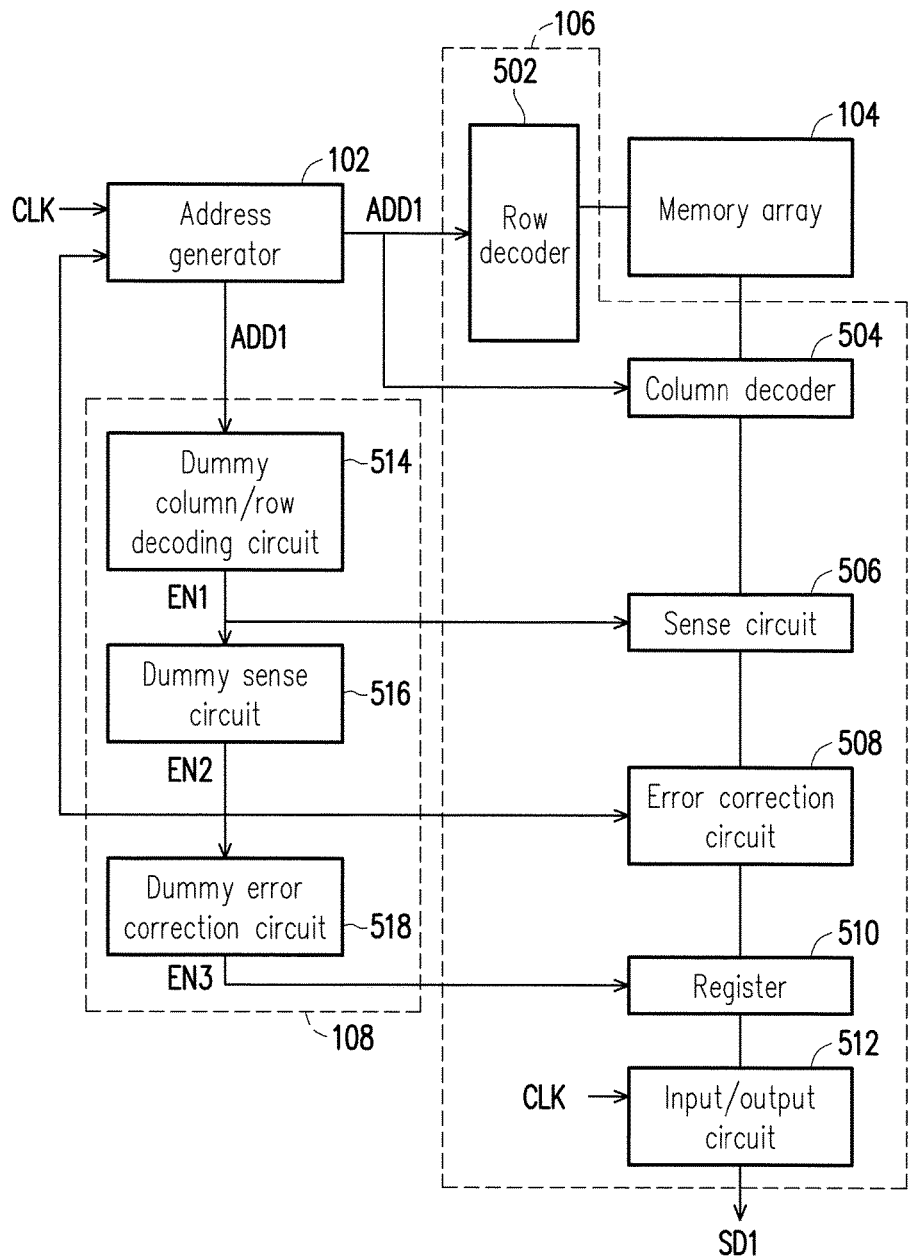
FIG. 5 is a schematic diagram of a memory device according to an embodiment of the invention.

With reference to FIG. 5, FIG. 5 is a schematic diagram of a memory device according to an embodiment of the invention. More specifically, in a memory device 500 of the present embodiment, the data access circuit 106 can include a row decoder 502, a column decoder 504, a sense circuit 506, an error correction circuit 508, a register 510 and an input/output circuit 512. Further, the dummy circuit 108 can include a dummy column/row decoding circuit 514, a dummy sense circuit 516, and a dummy error correction circuit 518. Among them, the row decoder 502 is coupled to the memory array 104 and the address generator 102; the column decoder 504 is coupled to the memory array 104, the address generator 102 and the sense circuit 506; the error correction circuit 508 is coupled to the sense circuit 506, the dummy sense circuit 516 and the register 510; the register 510 is coupled to the error correction circuit 508, the dummy sense circuit 516 and the input/output circuit 512.

The row decoder 502 is configured to selectively drive the word line of the memory array 104 according to the address signal ADD1. The column decoder 504 is configured to selectively drive the bit line of the memory array 104 according to the address signal ADD1. The sense circuit 506 is configured to sense data corresponding to the address signal ADD1 so as to generate sensed data. The error correction circuit 508 is configured to perform an error correction on the sensed data so as to output corrected data. The register 510 is configured to temporarily store the corrected data. The input/output circuit 512 outputs the read data SD1 according to the external clock signal CLK and the corrected data. Further, the dummy column/row decoding circuit 514 is configured to execute the selection operating procedure of the row decoder 502 and the column decoder 504 for selectively driving the word line and the bit line of the memory array 104 according to the address signal ADD1 and output an enabling signal EN1 for enabling the sense circuit 506 to sense the data corresponding to the address signal ADD1 and enabling the dummy sense circuit 516 to execute the data sense operating procedure of the sense circuit 506 for sensing the data corresponding to the address signal ADD1 when completing the selection operating procedure. In this way, the dummy sense circuit 516 can start executing the data sense operating sequence in synchronism with the sense circuit 506. Furthermore, if the memory device 500 needs to continue reading for the next address, the dummy column/row decoding circuit 514 can also simultaneously output the enabling signal EN1 at this time to enable the address generator 105 to generate the next address signal, so as to continue executing the selection operating procedure XY1 according to the next address signal thereby improving a reading efficiency of the memory device 500. When completing the data sense operating procedure, the dummy sense circuit 516 outputs an enabling signal EN2 for enabling the error correction circuit 508 to perform the error correction on the sensed data and enabling the dummy error correction circuit 518 to execute the error correction operating procedure of the error correction circuit 508 for performing the error correction on the sensed data. The dummy sense circuit 516 may be designed to simultaneously sense memory cells storing data of "1" and "0", and outputs the enabling signal EN2 after the memory cells storing data of "1" and "0" are all sensed. In this way, when the dummy sense circuit 516 completes the data sense operating procedure, it can be ensured that the sense circuit 506 also completes the data sense operating procedure. In addition, the dummy error correction circuit 508 can output an enabling signal EN3 for enabling the register 510 to temporarily store the corrected data when completing the error correction operating procedure.

Further, the dummy column/row decoding circuit 514 and the dummy error correction circuit 508 may be implemented by, for example, logical circuits. Also, the dummy column/row decoding circuit 514 and the dummy error correction circuit 508 can estimate the time points at which the selection operating procedure and the error correction operating procedure are completed with use of a longest logical path, so as to ensure that the selection operating procedure and the error correction operating procedure are both completed by the row decoder 502, the column decoder 504 and the error correction circuit 508 when the enabling signal EN1 and the enabling signal EN3 are to be outputted. It should be noted that, in the foregoing embodiment, the method of estimating the time point for enabling the data access circuit 106 to execute the next operating procedure by the dummy circuit 108 is described using an example in which the dummy circuit 108 executes the selection operating procedure, the data sense operating procedure and the error correction operating procedure. In other embodiments, based on different circuit designs for the data access circuit 106, the dummy circuit 108 may also correspondingly increase or decrease circuits for executing the operating procedures, so as to sequentially enable the operating procedures executed by the data access circuit 106 thereby improving the reading efficiency of the memory device.

Figure 6:
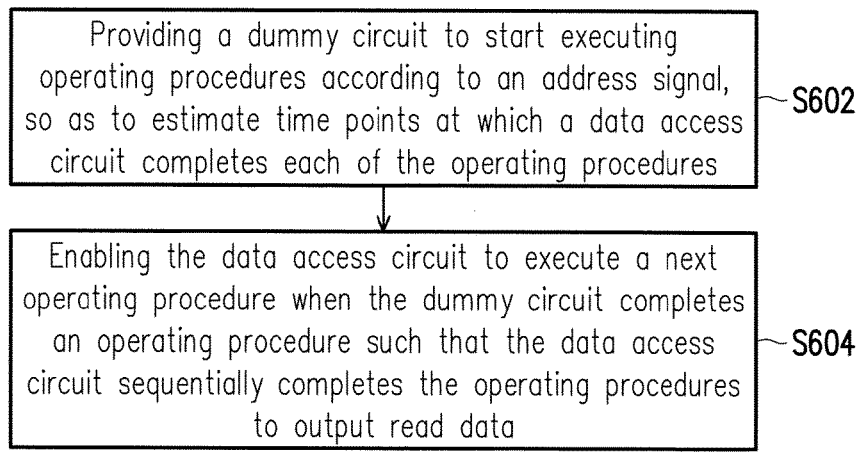
FIG. 6 is a flowchart of a data reading method of a memory device according to an embodiment of the invention.

With reference to FIG. 6, FIG. 6 is a flowchart of a data reading method of a memory device according to an embodiment of the invention. In view of the foregoing embodiments, the data reading method of the memory device can at least include the following steps. First of all, a dummy circuit is provided to start executing operating procedures according to an address signal, so as to estimate time points at which a data access circuit completes each of the operating procedures (step S602). Subsequently, the dummy circuit enables the data access circuit to execute a next operating procedure when completing an operating procedure such that the data access circuit sequentially completes the operating procedures to output read data (step S604). The dummy circuit and the data access circuit can have identical circuit features (e.g., they can be manufactured by identical manufacturing processes and circuit designs). For instance, a dummy column/row decoding circuit, a dummy sense circuit and a dummy error correction circuit may be provided. The dummy column/row decoding circuit can execute a selection operating procedure of a row decoder and a column decoder for selectively driving a word line and a bit line of a memory array according to the address signal, and enable a sense circuit to sense data corresponding to the address signal, enable the dummy sense circuit to execute a data sense operating procedure of the sense circuit for sensing the data corresponding to the address signal and enable an address generator to generate a next address signal when completing the selection operating procedure. When completing the data sense operating procedure, the dummy sense circuit enables an error correction circuit to perform an error correction on the sensed data, enables the dummy error correction circuit to execute an error correction operating procedure of the error correction circuit for performing the error correction on the sensed data and enables the address generator to generate a next address signal, such that the dummy column/row decoding circuit can continue executing the selection operating procedure according to the new address signal. The dummy error correction circuit enables a register to temporarily store corrected data when completing the error correction operating procedure. Further, an input/output circuit can be provided to output the read data according to an external clock signal and the corrected data.

In summary, the dummy circuit of the invention can perform the read operation in synchronism with the data access circuit according to the address signal, so as to estimate the time points at which the data access circuit completes each of the operating procedures, and enable the data access circuit to execute the next operating procedure when completing one operating procedure. Accordingly, the time points at which each of the operating procedures is executed in the reading operation are not restricted by the external clock signal, and instead, the operating schedule is assigned according to the time actually required for executing each of the operating procedures. As a result, the idle time during operation of the memory can be significantly reduced to effectively improve the reading efficiency of the memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A memory device, comprising:
a memory array;
an address generator, generating an address signal;
a data access circuit, coupled to the memory array and the address generator, and performing a reading operation on the memory array according to an external clock signal and the address signal so as to output read data, wherein the reading operation comprises a plurality of operating procedures; and
a dummy circuit, coupled to the data access circuit and the address generator, and executing the operating procedures according to the address signal, so as to estimate time points at which the data access circuit completes each of the operating procedures, wherein the dummy circuit enables the data access circuit to execute a next operating procedure when completing an operating procedure,
wherein the data access circuit comprises:
a row decoder, coupled to the memory array, the dummy circuit and the address generator, and selectively driving a word line of the memory array according to the address signal;
a column decoder, coupled to the memory array, the dummy circuit and the address generator, and selectively driving a bit line of the memory array according to the address signal;
a sense circuit, coupled to the dummy circuit and the column decoder, and enabled by the dummy circuit to sense data corresponding to the address signal so as to generate sensed data;
an error correction circuit, coupled to the dummy circuit and the sense circuit, and enabled by the dummy circuit to perform an error correction on the sensed data so as to output corrected data; and
a register, coupled to the dummy circuit and the error correction circuit, and enabled by the dummy circuit to temporarily store the corrected data.

2. The memory device according to claim 1, wherein the dummy circuit comprises:
a dummy column/row decoding circuit, coupled to the sense circuit and the address generator, and executing a selection operating procedure of the row decoder and the column decoder for selectively driving the word line and the bit line of the memory array according to the address signal;
a dummy sense circuit, coupled to the dummy column/row decoding circuit, the error correction circuit and the address generator, enabling the sense circuit to sense the data corresponding to the address signal and enabling the dummy sense circuit to execute a data sense operating procedure of the sense circuit for sensing the data corresponding to the address signal when the dummy column/row decoding circuit completes the selection operating procedure; and
a dummy error correction circuit, coupled to the dummy sense circuit and the register, enabling the error correction circuit to perform the error correction on the sensed data, enabling the dummy error correction circuit to execute an error correction operating procedure of the error correction circuit for performing the error correction on the sensed data and enabling the address generator to generate a next address signal when the dummy sense circuit completes the data sense operating procedure, and enabling the register to temporarily store the corrected data when the dummy error correction circuit completes the error correction operating procedure.

3. The memory device of claim 2, wherein the dummy column/row decoding circuit and the dummy error correction circuit are implemented by logical circuits, and the dummy column/row decoding circuit and the dummy error correction circuit estimate time points at which the selection operating procedure and the error correction operating procedure are completed with use of a longest logical path.

4. The memory device of claim 1, further comprising:
an input/output circuit, coupled to the register, and outputting the read data according to the external clock signal and the corrected data.

5. The memory device of claim 1, wherein the dummy sense circuit senses memory cells storing different data and enables the dummy error correction circuit after the memory cells storing different data are all sensed.

6. The memory device of claim 5, wherein the memory cells storing different data comprise memory cells storing data of "1" and "0".

7. The memory device according to claim 1, wherein the dummy circuit and the data access circuit have identical circuit features.

8. The memory device according to claim 1, wherein the dummy circuit and the data access circuit are manufactured by identical manufacturing processes and circuit designs.

9. The memory device according to claim 1, wherein the memory array is a flash memory array.

10. The memory device according to claim 1, wherein the memory array is a NOR flash memory array.

11. A data reading method of a memory device, the memory device comprising a memory array, an address generator and a data access circuit, the address generator generating an address signal, the data access circuit performing a read operation on the memory array according to an external clock signal and the address signal so as to output read data, the reading operation comprising a plurality of operating procedures, the data reading method of the memory device comprising:
providing a dummy circuit, and starting to execute the operating procedures by the dummy circuit according to the address signal, so as to estimate time points at which the data access circuit completes each of the operating procedures; and
enabling the data access circuit to execute a next operating procedure when the dummy circuit completes an operating procedure such that the data access circuit sequentially completes the operating procedures to output the read data,
wherein the data access circuit comprises a row decoder, a column decoder, a sense circuit, an error correction circuit and a register, and the data reading method of the memory device comprises:
providing a dummy column/row decoding circuit, and executing a selection operating procedure of the row decoder and the column decoder for selectively driving a word line and a bit line of the memory array by the dummy column/row decoding circuit according to the address signal;
providing a dummy sense circuit, enabling the sense circuit to sense data corresponding to the address signal and enabling the dummy sense circuit to execute a data sense operating procedure of the sense circuit for sensing the data corresponding to the address signal when the dummy column/row decoding circuit completes the selection operating procedure; and
providing a dummy error correction circuit, enabling the error correction circuit to perform an error correction on the sensed data, enabling the dummy error correction circuit to execute an error correction operating procedure of the error correction circuit for performing the error correction on the sensed data and enabling the address generator to generate a next address signal when the dummy sense circuit completes the data sense operating procedure, and enabling the register to temporarily store the corrected data when the dummy error correction circuit completes the error correction operating procedure.

12. The data reading method of the memory device according to claim 11, wherein the dummy column/row decoding circuit and the dummy error correction circuit are implemented by logical circuits, and the dummy column/row decoding circuit and the dummy error correction circuit estimate time points at which the selection operating procedure and the error correction operating procedure are completed with use of a longest logical path.

13. The data reading method of the memory device according to claim 11, further comprising:
providing an input/output circuit, the input/output circuit outputting the read data according to the external clock signal and the corrected data.

14. The data reading method of the memory device according to claim 11, wherein the dummy sense circuit senses memory cells storing different data and enables the dummy error correction circuit after the memory cells storing different data are all sensed.

15. The data reading method of the memory device according to claim 14, wherein the memory cells storing different data comprise memory cells storing data of "1" and "0".

16. The data reading method of the memory device according to claim 11, wherein the dummy circuit and the data access circuit have identical circuit features.

17. The data reading method of the memory device according to claim 11, wherein the dummy circuit and the data access circuit are manufactured by identical manufacturing processes and circuit designs.

18. The data reading method of the memory device according to claim 11, wherein the memory array is a flash memory array.

* * * * *